(12) United States Patent
Britt et al.

(10) Patent No.: US 11,946,160 B2
(45) Date of Patent: Apr. 2, 2024

(54) METHOD FOR PRODUCING A CRYSTALLINE FILM ON A SUBSTRATE SURFACE

(71) Applicant: MATRIX SENSORS, INC., San Diego, CA (US)

(72) Inventors: David K Britt, El Cerrito, CA (US); Paul R Wilkinson, El Segundo, CA (US); Steven Yamamoto, San Diego, CA (US)

(73) Assignee: Matrix Sensors, Inc, San Diego, CA (US)

( * ) Notice: Subject to any disclaimer, the term of this patent is extended or adjusted under 35 U.S.C. 154(b) by 0 days.

(21) Appl. No.: 18/129,829

(22) Filed: Apr. 1, 2023

(65) Prior Publication Data

US 2023/0279582 A1    Sep. 7, 2023

Related U.S. Application Data

(62) Division of application No. 17/198,204, filed on Mar. 10, 2021, now Pat. No. 11,643,751.

(Continued)

(51) Int. Cl.
*C30B 28/04* (2006.01)
*C07F 9/00* (2006.01)
(Continued)

(52) U.S. Cl.
CPC ............. *C30B 28/04* (2013.01); *C07F 9/00* (2013.01); *C07F 15/04* (2013.01); *C08J 5/18* (2013.01); *C30B 29/58* (2013.01); *G01G 3/165* (2013.01)

(58) Field of Classification Search
CPC ......... C30B 29/58; C30B 7/00; C30B 19/106; C30B 19/06; C30B 33/12; C30B 28/04; C08J 5/18
See application file for complete search history.

(56) References Cited

U.S. PATENT DOCUMENTS

| | | | | |
|---|---|---|---|---|
| 5,245,457 A | * | 9/1993 | Fukuchi | G02F 1/133345 349/138 |
| 5,336,535 A | * | 8/1994 | Fukuchi | G02F 1/133345 349/122 |

(Continued)

*Primary Examiner* — Jaehwan Oh
(74) *Attorney, Agent, or Firm* — Mark B. Floyd

(57) ABSTRACT

An apparatus and method is provided for coating a surface of a material with a film of porous coordination polymer. A first substrate having a first surface to be coated is positioned in a processing chamber such that the first surface is placed in a substantially opposing relationship to a second surface. In some embodiments, the second surface is provided by a wall of the processing chamber, and in other embodiments the second surface is provided by a second substrate to be coated. The first substrate is held such that a gap exists between the first and second surfaces, and the gap is filled with at least one reaction mixture comprising reagents sufficient to form the crystalline film on at least the first surface. A thin gap (e.g., having a thickness less than 2 mm) between the first and second surfaces is effective for producing a high quality film having a thickness less than 100 μm. Confining the volume of the reaction mixture to a thin layer adjacent the substrate surface significantly reduces problems with sedimentation and concentration control. In some embodiments, the size, shape, or average thickness of the gap is adjusted during formation of the film in response to feedback from at least one film growth monitor.

11 Claims, 11 Drawing Sheets

Related U.S. Application Data

(60) Provisional application No. 62/987,866, filed on Mar. 10, 2020.

(51) Int. Cl.
  *C07F 15/04* (2006.01)
  *C08J 5/18* (2006.01)
  *C30B 29/58* (2006.01)
  *G01G 3/16* (2006.01)

(56) References Cited

U.S. PATENT DOCUMENTS

| | | | |
|---|---|---|---|
| 2017/0173623 A1* | 6/2017 | Britt | B01J 20/226 |
| 2018/0010861 A1* | 1/2018 | Wakaoka | H01L 23/427 |
| 2019/0255510 A1* | 8/2019 | Britt | B05C 11/1007 |
| 2021/0387161 A1* | 12/2021 | Britt | B05C 11/1007 |
| 2022/0010438 A1* | 1/2022 | Crettenand | C25B 13/02 |

* cited by examiner

METHOD FOR PRODUCING A CRYSTALLINE FILM ON A SUBSTRATE SURFACE

CROSS REFERENCE TO RELATED APPLICATIONS

This application is a divisional of U.S. patent application Ser. No. 17/198,204 filed Mar. 10, 2021 which in turn claims the benefit of U.S. provisional patent application 62/987,866 filed on Mar. 10, 2020. All of these applications are hereby incorporated by reference in their entirety.

The invention was made with government support under award DE-AR0000933 awarded by the Department of Energy. The government has certain rights to the invention.

BACKGROUND

The invention relates generally to devices and methods for the synthesis of a porous coordination polymer (PCP), and in particular to an apparatus and method for producing a crystalline film of a porous coordination polymer on the surface of a substrate.

An established method for synthesis of porous coordination polymer (PCP) coatings relies on the stepwise introduction of reagents with an intermediary wash step, often referred to as liquid phase epitaxy. This method requires considerable time and solvent to make a single film, which is undesirable.

Another established method for synthesis of PCP coatings relies on immersing a substrate in a beaker of reagents. This method has several disadvantages including sedimentation or clouding, wherein particles nucleated in the volume of reagent fluid will deposit onto the substrate, which compromises the film quality. It is desirable to nucleate and grow a film on the substrate, but not to deposit "sediment" from the volume of reagents in the beaker. Another disadvantage of this method is lack of concentration control. In the beaker, reagent species may diffuse away from the substrate, which prevents nucleation on the substrate surface. A further disadvantage is lack of reaction endpoint control. In a beaker there is an almost "infinite" amount of reagent and so the reaction will continue as long as the substrate is in the beaker.

SUMMARY

The present invention provides devices and methods for producing a film of porous coordination polymer (PCP), such as a metal-organic framework (MOF).

According to an aspect, an apparatus is provided for producing a film of porous coordination polymer. The apparatus has at least one processing chamber for producing a crystalline film on at least one substrate surface. The apparatus comprises at least one substrate positioner for positioning at least a first substrate having a first surface to be coated in the processing chamber. The first substrate is positioned such that the first surface is placed in a substantially opposing relationship to a second surface. In some embodiments, the second surface is provided by a wall of the processing chamber, and in other embodiments the second surface is provided by a second substrate to be coated with another crystalline film concurrently with the first substrate. The first substrate is held such that a gap exists between the first and second surfaces, and the gap has an average thickness. The apparatus also comprises reagent delivery means for filling the gap with a reaction mixture or a series of reaction mixtures comprising reagents sufficient to form the crystalline film on at least the first surface. A thin gap between the first and second surfaces (e.g., a gap having a thickness less than 2 mm) is surprisingly effective for producing a high quality film having a thickness less than 100 μm. Confining the volume of the reaction mixture to a thin layer adjacent the substrate surface significantly reduces problems with sedimentation and concentration control, and improves the quality of the film. The thin layer of reaction mixture is defined by the geometry of the gap between the first and second surfaces, so that high quality films are produced by controlling the size, shape, or average thickness of the gap. In some embodiments, the substrate positioner is adjustable to change the position of the first substrate, and thus change the position of the first surface relative to the second surface, during formation of the film in response to feedback from a film growth monitor.

According to another aspect, a method is provided for producing a crystalline film on at least one substrate surface. The method comprises the step of holding at least a first substrate having a first surface to be coated such that the first surface is positioned in a substantially opposing relationship to a second surface. In some embodiments, the second surface is provided by a wall of a processing chamber, and in other embodiments the second surface is provided by a second substrate to be coated with another crystalline film. The first substrate is held such that a gap exists between the first and second surfaces, and the gap has an average thickness. The gap is filled with a reaction mixture or a series of reaction mixtures comprising reagents sufficient to form the crystalline film on at least the first surface. A thin gap between the surfaces (e.g., a gap having a thickness less than 2 mm) is surprisingly effective for producing a high quality film having a thickness less than 100 μm. Confining the volume of the reaction mixture to a thin layer adjacent the substrate surface significantly reduces problems with sedimentation and concentration control, and improves the quality of the film. The thin layer of reaction mixture is defined by the geometry of the gap between the first and second surfaces, so that high quality films are produced by controlling the size, shape, or average thickness of the gap.

BRIEF DESCRIPTION OF THE DRAWINGS

The foregoing aspects and advantages of the present invention will become better understood upon reading the following detailed description and upon reference to the drawings where.

DETAILED DESCRIPTION OF PREFERRED EMBODIMENTS

The present invention provides devices and methods for producing films of porous coordination polymers. Suitable porous coordination polymers include porous crystalline materials such as metal-organic frameworks (MOFs) or porous coordination frameworks. Preferred MOF subclasses include zeolitic imidazolate framework (ZIF), Isoreticular MOF (IRMOF), and multivariate MOF (MTV-MOF) made using a mix of organic linkers having the same geometry but varied chemical functionality. Suitable porous coordination polymers also include a covalent organic framework (COF) in which the framework includes covalent chemical bonds rather than metal coordination bonds. In rare embodiments, the porous coordination polymers comprise non-crystalline porous materials such as metal-organic polyhedra having discreet porous cages, porous metal-organic polymer, or metal-organic gel.

Metal-organic frameworks are an expanding class of porous crystalline materials that are built up from nodes of metal ions connected by organic linkers. These materials can typically be engineered to have pore apertures with a width or diameter in a range of less than 1 Angstrom to about 30 Angstroms (Yaghi, et. al., Nature 423, 705-714, Jun. 12, 2003). A class of exotic MOFs ("MOF-74") with pore aperture diameters of 98 Angstroms have also been demonstrated (Deng, et. al., Science 336, 1018, 2012). MOFs with varying pore sizes can selectively adsorb molecules based on the size of the molecules. For example, engineered MOFs with pore sizes designed for carbon dioxide ($CO_2$) adsorption can separate gases in industrial processes (Du, et. al., J. Am. Chem. Soc., 2013, 135 (2), pp 562-565). MOFs can also be used as receptor layers with a Quartz Crystal Microbalance (QCM) to act as a chemical sensor in controlled environments.

The pore size of the MOF (e.g., the average width, diameter or volume of the pore apertures) is preferably chosen to achieve a degree of selectivity of adsorbed molecules based on the size of the molecules. In some embodiments, the material (e.g., a substrate) that is coated with a film is a resonating member of a resonant sensor. Resonant sensors (e.g., quartz crystal microbalance, cantilever, membrane and piezoelectric resonator-based sensors) use target molecules adsorbed in the sensing material (e.g., a MOF film coated on the sensor) to change properties that are reflected in the resonance frequency.

Figure 1:
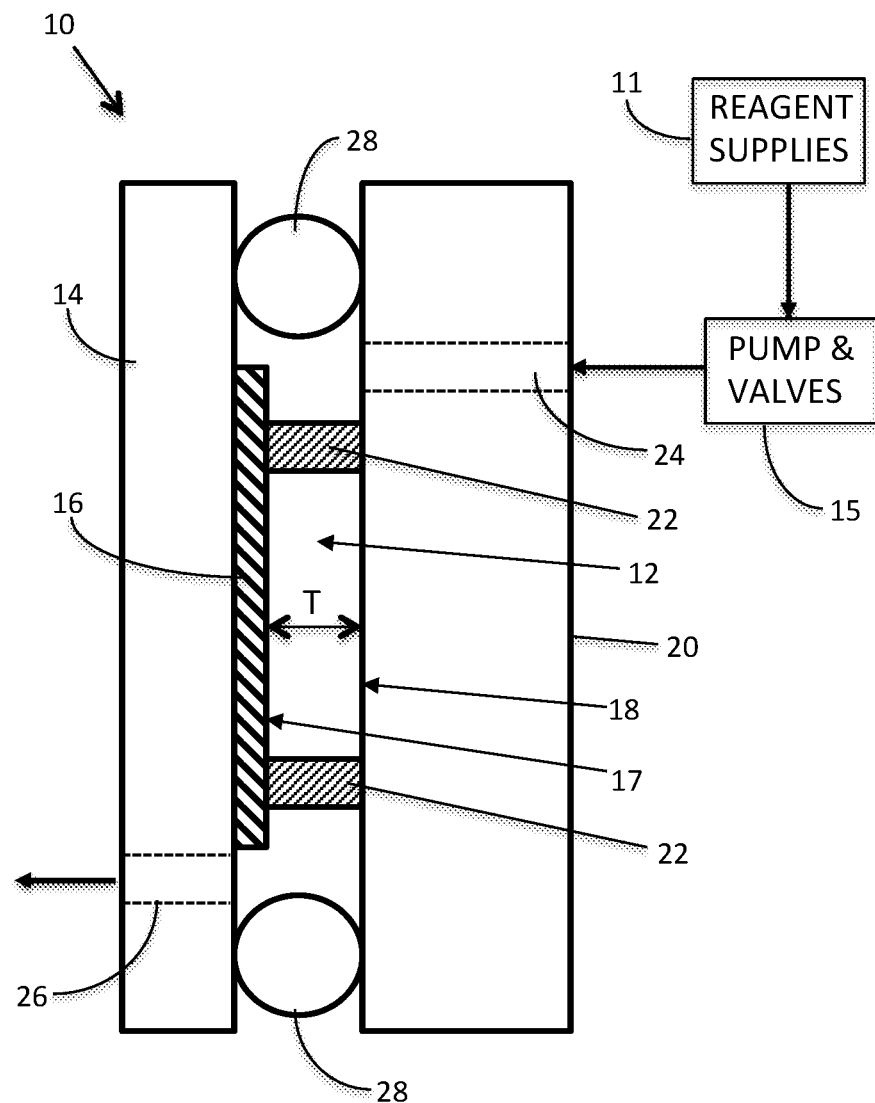
FIG. 1 is a schematic block diagram of an apparatus for producing a film on a substrate surface using a substrate holder and a reference surface, according to some embodiments.

FIG. 1 shows an apparatus 10 having a processing chamber 12 for producing a crystalline film on a substrate surface. The apparatus includes at least one substrate positioner 14 for holding and positioning at least a first substrate 16 having a first surface 17 to be coated in the processing chamber 12. The substrate 16 is positioned such that its first surface 17 is placed in an opposing relationship to a second surface 18 of a wall 20 of the processing chamber 12. The substrate 16 is positioned such that there is a gap having an average thickness T between the first and second surfaces 17 and 18. In this first embodiment, the first and second surfaces 17 and 18 are substantially parallel so that the thickness of the gap is uniform. In alternative embodiments described below, the substrate surface 17 may be tilted or angled relative to the second surface 18 so that the thickness of the gap between the surfaces varies from point to point, but the average thickness T of the gap is important for producing a crystalline film of high quality.

Spacers 22 are positioned between the surfaces 17 and 18. The spacers 22 (e.g., shims, wedges or posts) separate the surfaces 17 and 18 and determine the size, shape and average thickness T of the gap between the surfaces. A fluid inlet port 24 is formed in the wall 20 and a fluid outlet port 26 is formed in the substrate holder 14 for convenient filling and draining of the processing chamber 12. The processing chamber 12 is filled with a reaction mixture (or a series of different reaction mixtures according to some recipes for producing a PCP film in stages) containing reagents sufficient to form the crystalline film. In this example, the processing chamber 12 is filled with at least one reaction mixture that is pumped from one or more reagent supply sources 11, typically through flow channels connecting the reagent supply source(s) 11 to the fluid inlet 24 with a pump and valve system 15. These and many other suitable means for delivering reagents to a chamber are well known, including automated or manual delivery. Liquid seals 28 (e.g., O-rings) are positioned between the wall 20 and the substrate holder 14 to seal the ends of the processing chamber 12.

In operation, the gap between the surfaces 17 and 18 is filled with a reaction mixture (e.g., reagents in solution) through the inlet port 24. The reaction mixture comprises reagents sufficient to form a crystalline film on the first surface 17 of the substrate 16. As an example, a suitable reaction mixture is a solution of 1.29 g pyrazine, 0.2 mL 50% hydrofluoric acid, 1.0 g $NiNbOF_5$, and 20 mL water. The processing chamber 12 is sealed and heated to a temperature such as 130° C. for a time period, such as 18 hours. The processing chamber 12 is then drained of the reaction mixture and optionally rinsed with water or rinse solution. Many other reaction mixtures, recipes, and protocols for producing a film are possible in other embodiments. Recipes for the synthesis of metal-organic frameworks are well known in the art (see, for example, Rowsell et al, Microporous and Mesoporous Materials 2004, 73, 3-14). Typically, the preparation of a MOF involves heating a reaction mixture containing inorganic salts and organic compounds in a solvent such as dimethylformamide (DMF) at a specific temperature such as in the range of 60° C. to 120° C., for a time period in the range of several hours to two days.

When the crystalline film is fully formed on the substrate surface 17, the film preferably has a final film thickness less than 100 µm, and more preferably in the range of about 10 nm to 10 µm. In some embodiments, the crystalline film has a thickness in the range of about 1 nm to 20 µm. In some embodiments, the film has a thickness in the range of about 1 nm to 10 µm. In some embodiments, the crystalline film has a thickness in the range of about 10 nm to 5 µm.

The substrate positioner 14 and the spacers 22 are preferably adjustable to change the position of the first substrate 16, and thus change the position of the first surface 17 relative to the second surface 18 such that the average thickness T of the gap is less than 2 mm, preferably in the range of about 1 µm to 1 mm. In some embodiments, the average thickness T of the gap is in the range of about 0.1 µm to 1 mm. In some embodiments, the average thickness T of the gap is in the range of about 1 µm to 500 µm. In some embodiments, the average thickness T of the gap is in the range of about 40 nm to 2 mm, and in other embodiments the average thickness T of the gap is in the range of 20 to 80 µm.

The average thickness T of the gap has a ratio to the final film thickness that is preferably in the range of 2:1 to 1,000:1. In some embodiments, the average thickness T of the gap has a ratio to the final film thickness that is in the range of about 10:1 to 300:1, and in some embodiments the ratio is in the range of about 20:1 to 100:1. The relatively thin gap between the surfaces 17, 18 confines the fluid reaction mixture to a thin layer of reagents adjacent the substrate surface 17 during formation of the crystalline film. By confining the volume of the reaction mixture (e.g., reagents in a liquid solution) to a thin layer of reagents adjacent the substrate surface 17 during formation of the crystalline film, problems with sedimentation and concentration control are significantly reduced, and the quality of the crystalline film is improved. The thin layer of reaction mixture between the surfaces 17 and 18 is defined by the geometry of the gap between the surfaces. In some embodiments, the average thickness T of the gap is less than a diffusion length of the reagents in solution so that the reagents do not diffuse away from the surface 17 to be coated with a film.

Figure 2:
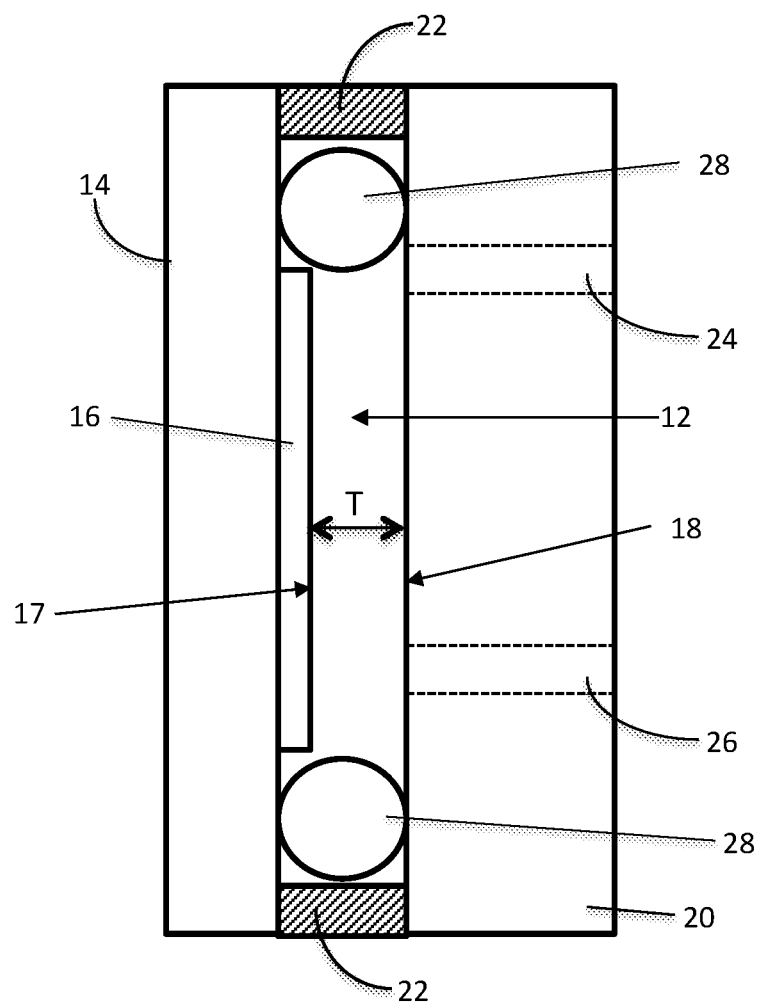
FIG. 2 is a schematic block diagram of another apparatus for producing a film on a substrate surface using a substrate holder and a reference surface, according to other embodiments.

FIG. 2 shows a schematic, block diagram of another embodiment of the apparatus. In this embodiment, the fluid inlet port 24 and the outlet port 26 are formed in the wall 20, and the spacers 22 are positioned outside of the processing chamber 12. The seals 28 (e.g., o-rings) are positioned to seal the ends of the processing chamber 12, and the spacers 22 are positioned outside of the processing chamber 12 between the substrate holder 14 and the wall 20. This arrangement allows an operator to easily make adjustments to the size, shape or average thickness T of the gap from outside of the processing chamber 12, as opposed to the first embodiment in which the spacers 22 are positioned within the chamber. In either embodiment, suitable spacers include: shims to set the gap size and the tilt of the substrate 16, posts (that may have an adjustable length), a continuous gasket, or other structures made of plastic, glue, epoxy or wax. It is not necessary for the spacers 22 to be adjustable, but it is desirable in some embodiments to adjust the gap size and/or the tilt of the substrate 16 having the first surface 17. For example, in some embodiments, the gap between the first and second surfaces 17 and 18 is adjusted to maintain a substantially constant growth rate of the film.

Figure 3A:
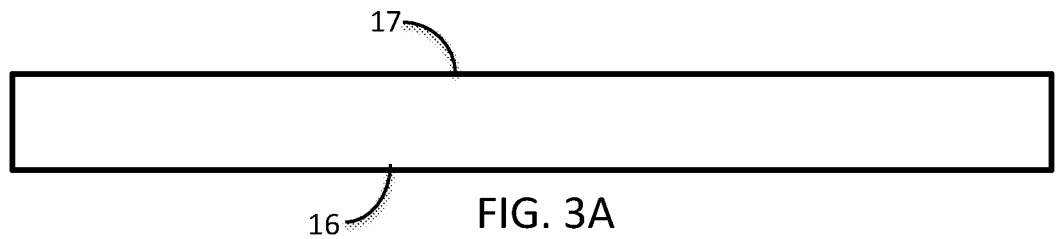
FIGS. 3A-3D are schematic, side views of process steps for producing patterned MOF films on a substrate surface using a pre-cursor etch, according to some embodiments.
Figure 3B:
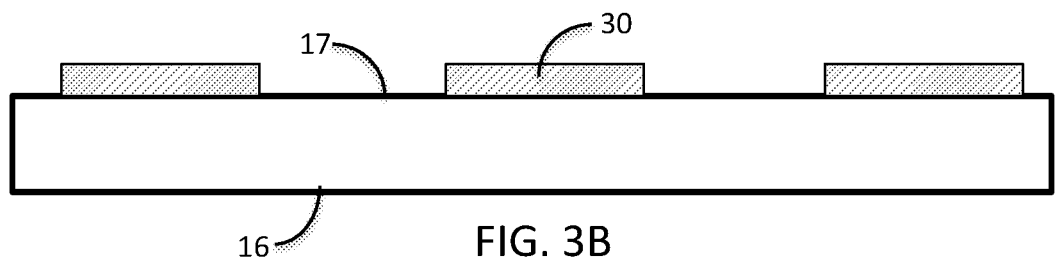

FIGS. 3A-3D are schematic, side views that illustrate process steps for producing patterned MOF films on a substrate surface. In FIG. 3A, the substrate 16 has a first surface 17 to be coated with a patterned MOF film. In FIG. 3B, a metal source 30 is deposited on some portions of the surface 17 in a desired pattern. Suitable metal sources for this purpose, include but are not limited to: nickel metal, niobium metal, nickel oxide, niobium oxide, other elemental metals, other metal oxides, nitrides, potentially even alloys or mixed oxides. In some cases, the metal sources are transition metals, alkaline earth metals (mainly Mg), and main group metals such as Al, Ga, In, and potentially others. The metal source 30 is preferably deposited in a pattern on the surface 17 by masked deposition.

Figure 3C:
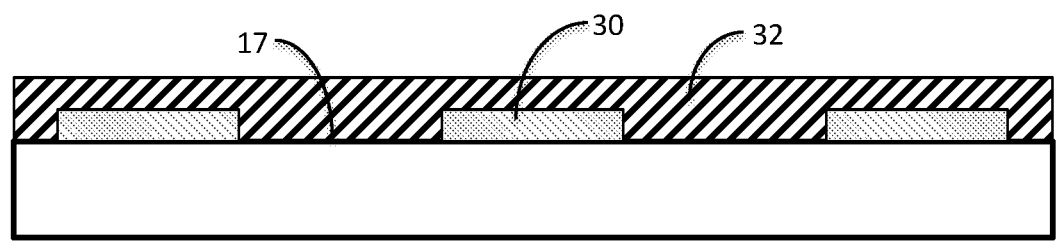
Figure 3D:
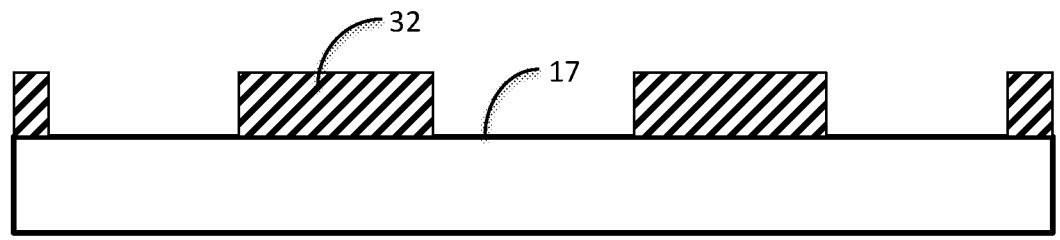

In FIG. 3C, a MOF film 32 is grown on the surface 17 by holding the substrate 16 such that its first surface 17 is in an opposing relationship to a second surface (not shown) with a gap between the surfaces, as previously described with reference to FIG. 1 or FIG. 2. Portions of the film 32 that cover the patterned metal source 30 are then etched away to form a patterned MOF film on the surface 17. FIG. 3D shows the resulting structure where the MOF film 32 has a desired pattern on the surface 17.

In some cases, the substrate has patterned metal films on the surface for making electrical contact to a device, and a simple, useful MOF pattern is to confine the MOF to a non-metalized area of the surface so as not to interfere with electrical connections. A second patterning example is to lithographically create multiple regions of MOFs for different gas sensing materials, thereby enabling a multi-gas sensor on a single substrate. A third patterning example is for a multi-pixel display where the MOF is used to orient the emission of light and the MOF is patterned on each pixel of the display. In some embodiments, the patterned MOF film 32 is useful for certain devices, such as a chemical sensor.

Figure 4A:
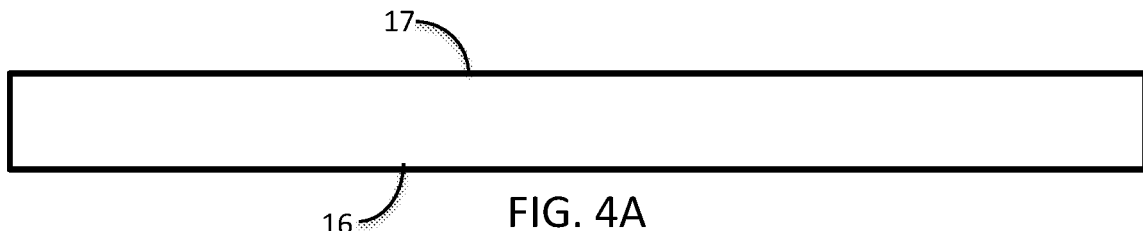
FIGS. 4A-4D are schematic, side views of process steps for producing patterned MOF films on a substrate surface using patterned nucleation resist material, according to other embodiments.
Figure 4B:
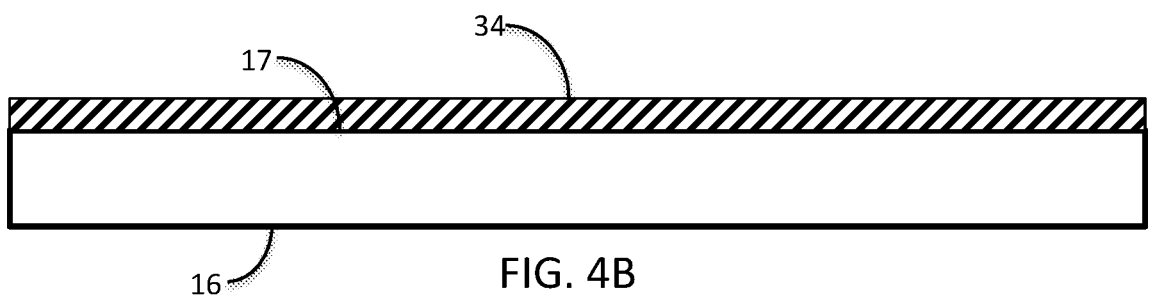

FIGS. 4A-4D are schematic, side views that illustrate process steps for producing patterned MOF films on a substrate surface using patterned nucleation resist material. In FIG. 4A, the substrate 16 has a first surface 17 to be coated with a patterned MOF film. In FIG. 4B, a layer of nucleation material 34 is deposited on the substrate surface 17. Suitable nucleation materials for this purpose include but are not limited to: metal or metal-oxide (Nb or $Nb_2O_5$) deposited by sputtering or e-beam evaporation methods. Other nucleation materials are: self-assembled monolayers of thiol- or silane-based molecules that preferentially attach and orient to gold or silicon surfaces in solution. In some cases, nucleation materials include pre-cursor materials or pre-coatings on the surfaces of the substrates, such as a metal oxide, a noble metal or metal source, a metal oxide coated with a functionalized self-assembled monolayer (SAM), a ligand precursor, multiple precursor layers (such as Nb and Ni), or a more complex material including at least one of these components.

Figure 4C:
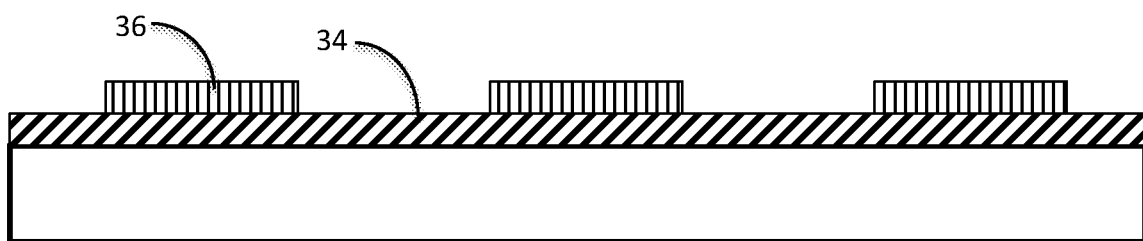

In FIG. 4C, a nucleation resist material 36 is deposited on some portions of the layer of nucleation material 34 such that other portions of the layer of nucleation material 34 remain exposed in a desired pattern for the MOF film to be produced. Suitable nucleation resist materials for this purpose include, but are not limited to: acid-resistant cross-linked polymers or silicon dioxide. The nucleation resist material 36 is preferably deposited in a pattern on the layer of nucleation material 34 by masked deposition.

Figure 4D:
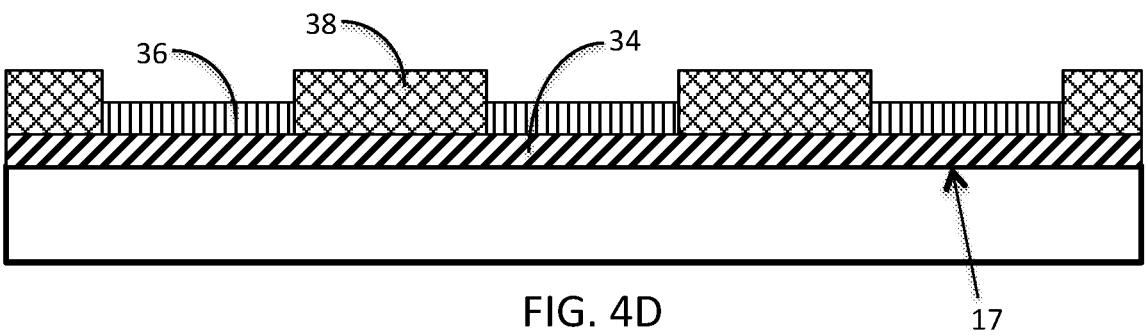

In FIG. 4D, a patterned MOF film 38 is grown on the exposed portions of the layer of nucleation material 34 that are not covered by the nucleation resist material 36. The patterned MOF film 38 is produced by holding the substrate 16 such that its first surface 17 is in an opposing relationship to a second surface (not shown) with a gap between the surfaces, as previously described with reference to FIG. 1 or FIG. 2. The patterned MOF film 38 grows only on the exposed portions of the nucleation material 34 that is not covered by the nucleation resist material 36. The MOF film 38 does not grow on the nucleation resist material 36 so that the resulting MOF film 38 has a desired pattern on the surface of the substrate 16.

Figure 5A:
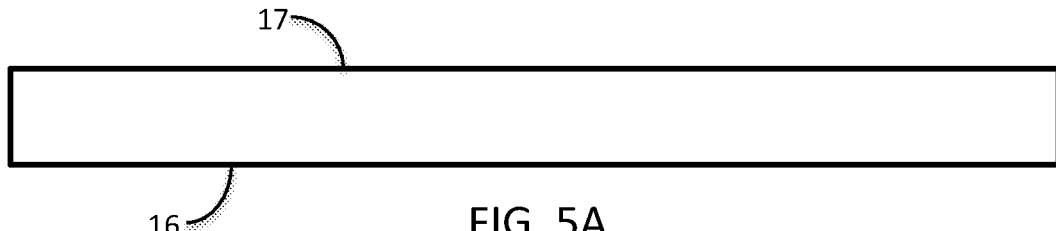
FIGS. 5A-5D are schematic, side views of process steps for producing patterned MOF films on a substrate surface using patterned nucleation material, according to other embodiments.
Figure 5B:
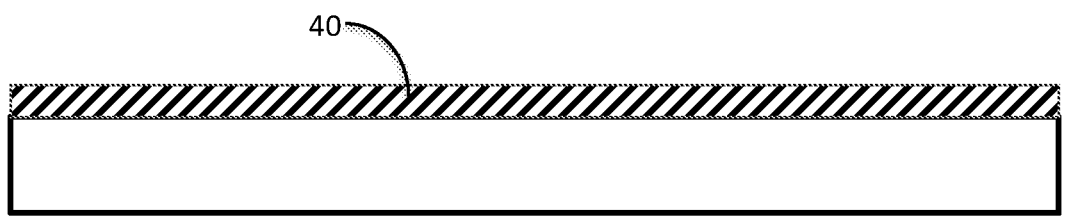
Figure 5C:
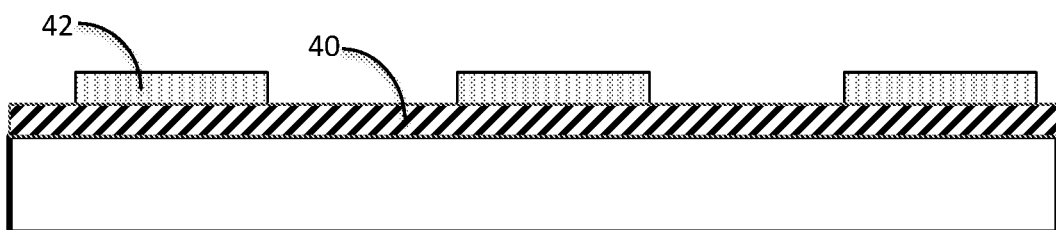

FIGS. 5A-5D are schematic, side views of process steps for producing patterned MOF films on a substrate surface using patterned nucleation material. In FIG. 5A, the substrate 16 has a first surface 17 to be coated with a patterned MOF film. In FIG. 5B, a layer of nucleation resist material 40 is deposited on the substrate surface 17. Suitable nucleation resist materials for this purpose include, but are not limited to: acid-resistant crosslinked polymers or silicon dioxide. In FIG. 5C, a nucleation material 42 is deposited on some portions of the layer of nucleation resist material 40 in a desired pattern for the MOF film to be produced. The nucleation material 42 is preferably deposited in a pattern by masked deposition.

Figure 5D:
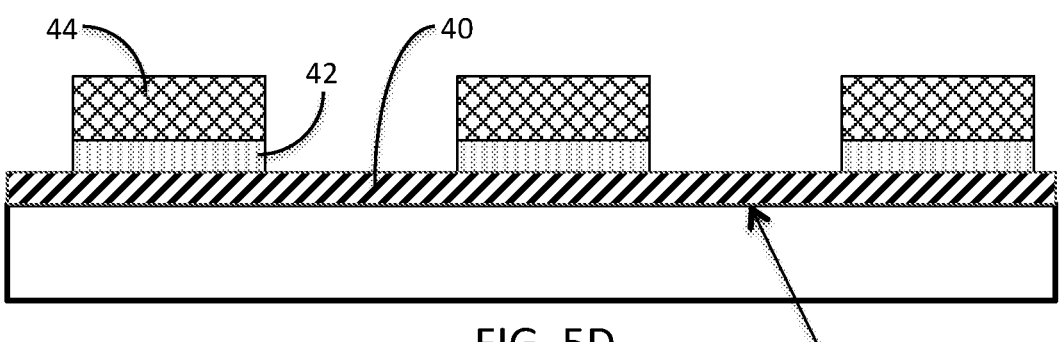

Suitable nucleation materials include but are not limited to: metal or metal-oxide (Nb or $Nb_2O_5$) deposited by sputtering or e-beam evaporation methods. Other nucleation materials are: self-assembled monolayers of thiol- or silane-based molecules that preferentially attach and orient to gold or silicon surfaces in solution. In FIG. 5D, a patterned MOF film 44 is grown on the patterned nucleation material 42. The patterned MOF film 44 is produced by holding the substrate 16 such that its first surface 17 is in an opposing relationship to a second surface (not shown) with a gap between the surfaces, as previously described with reference to FIG. 1 or FIG. 2. The patterned MOF film 44 grows substantially only on the nucleation material 42, and does not grow on the nucleation resist material 40 so that the resulting MOF film 44 has a desired pattern on the surface of the substrate 16.

Figure 6:
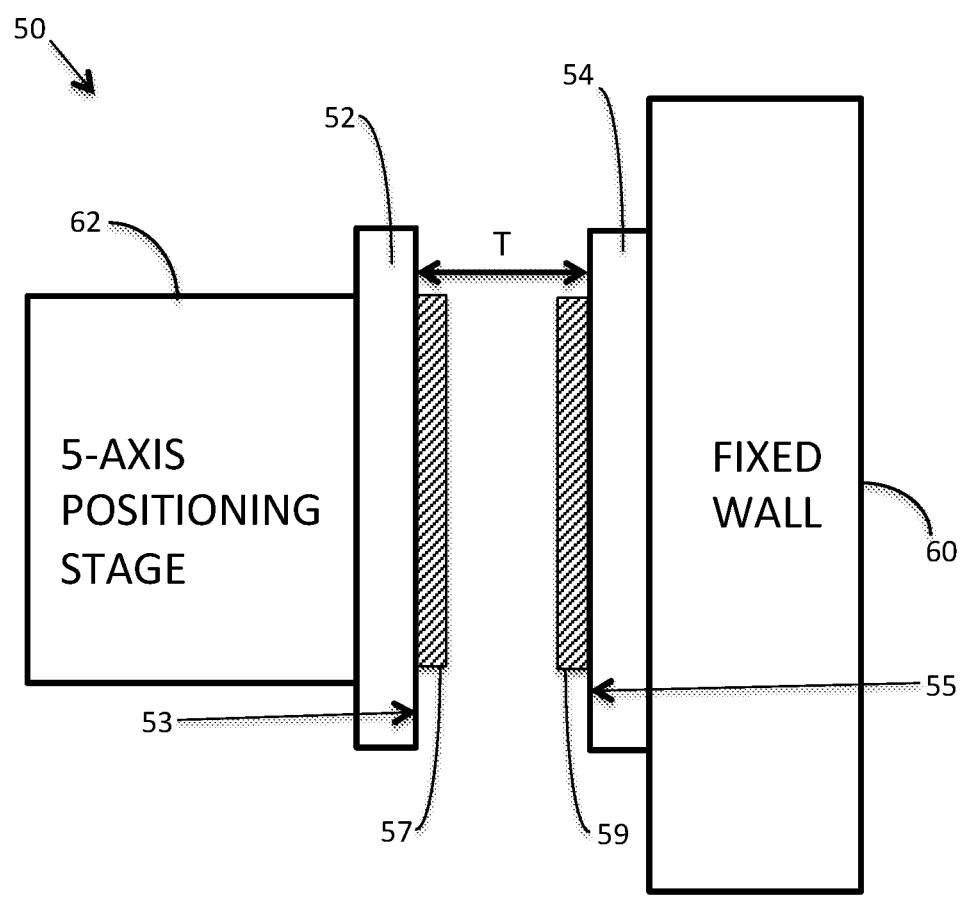
FIG. 6 is a schematic block diagram of a positioning device that holds a first substrate in an opposing relationship to a second substrate positioned against a fixed wall.

FIG. 6 shows another embodiment of an apparatus 50 in which multiple substrates are coated with crystalline films concurrently. A first substrate 52 has a first surface 53 that is coated with a film 57, and a second substrate 54 has a second surface 55 that is coated with a film 59. In this embodiment, the first substrate holder for holding and positioning the first substrate 52 comprises a multi-axis positioning stage 62 (e.g., a motorized 5-axis positioning stage: x, y, z, theta, phi). The multi-axis positioning stage 62 is arranged to adjust the average thickness T of the gap between the first surface 53 and the second surface 55 and to adjust the tilt of the first surface relative to the second surface.

The second substrate 54 may be simply held against a fixed wall 60 of the processing chamber such that the first and second surfaces 53 and 55 are in a substantially opposing relationship that may be parallel or include tilt of the first surface 53 relative to the second surface 55, as described below. In some embodiments, the fixed wall 60 may include notches, grooves, ledges or clamps for holding the second substrate 54. Note that only one of the substrates needs to be position-controlled. This allows the average thickness T of the gap between the substrate surfaces and the tilt to be adjusted to create a gap having a desired size and shape between the first and second surfaces 53 and 55. The gap is filled with at least one reaction mixture (or a series of reaction mixtures depending upon the particular recipe being used) containing reagents sufficient to form the films 57, 59 from one or more reagent supply sources, typically through one or more flow channels with a pump and valve system (not shown in FIG. 6). These and many other suitable means for delivering reagents to a gap or chamber are well known, including automated or manual delivery.

Figure 7:
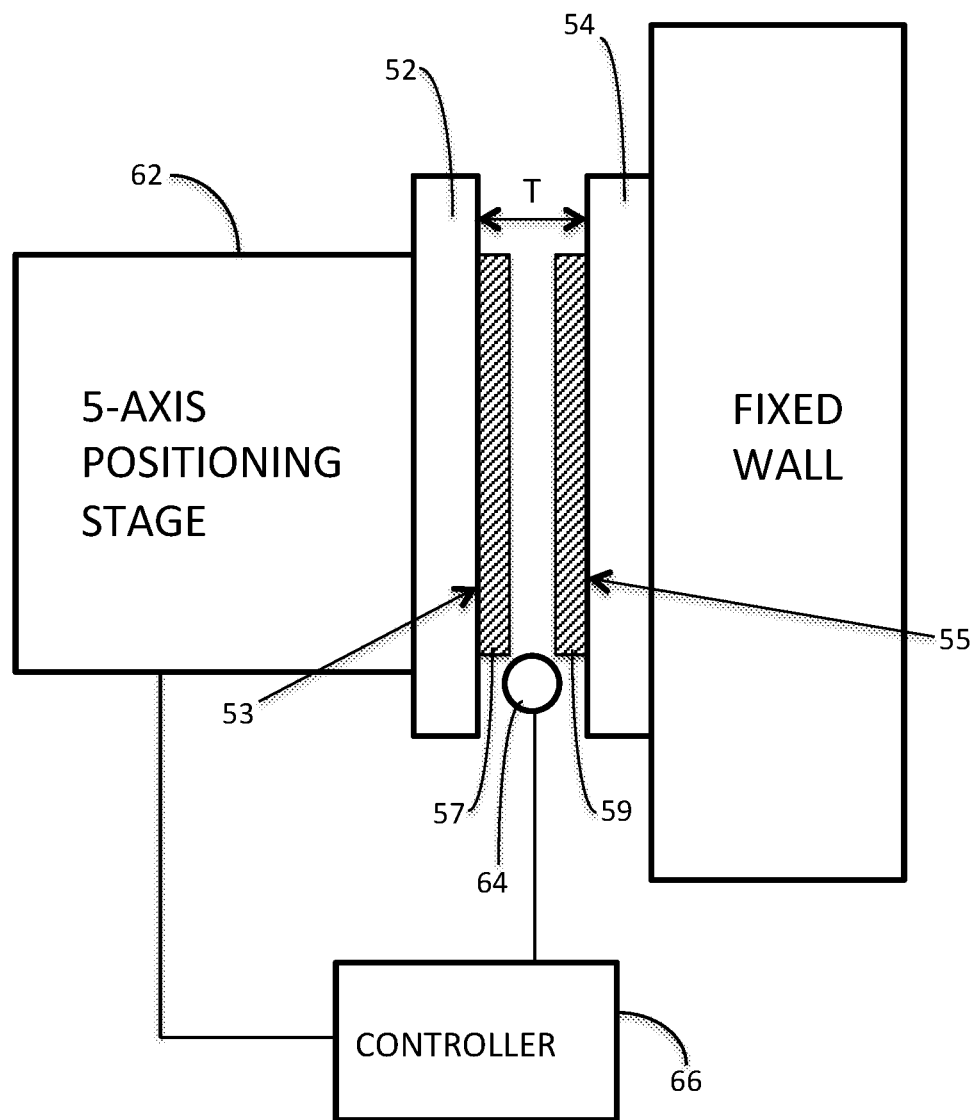
FIG. 7 is a schematic block diagram of an apparatus for producing crystalline films on substrates with film growth monitoring, according to some embodiments.

FIG. 7 shows another embodiment of the apparatus in which film growth is monitored. At least one film growth monitor 64 is arranged to monitor the growth of one or both of the crystalline films 57 and 59. It is to be understood that film growth monitoring and feedback control of the gap size and/or reagent conditions may also be used in embodiments in which a single film is formed on a single substrate, as in the embodiments of FIG. 1 and FIG. 2. Suitable devices and methods for film growth monitoring include optical imaging, resonant frequency for mass, or electrical measurement such as capacitance. These and other devices and techniques for monitoring film growth are known in the art.

Referring again to FIG. 7, the apparatus also includes a controller 66 (e.g., a microchip, processor, laptop, electronic processing device, etc.) in communication with the film growth monitor 64 and the substrate positioner (e.g., a multi-axis positioning stage 62) that positions the first substrate 52. The controller 66 is programmed to control the multi-axis positioning stage 62, based on feedback (e.g., signals) from the film growth monitor 64, to move the first substrate 52 to adjust the size and/or shape of the gap between the first and second substrates 52 and 54 in order to achieve a desired film growth on one or both of the surfaces 53 and 55.

In a first example, the controller 66 is programmed to control the multi-axis positioning stage 62, based on the feedback from the film growth monitor 64, to adjust the average thickness T of the gap between the first and second surfaces 53 and 55 to maintain a substantially constant growth rate of the film(s). In a second example, the film growth monitor 64 (or multiple film growth monitors) is arranged to monitor growth of at least the first film 57 at multiple points on the first surface 53. The controller 66 is programmed to control the substrate positioner 62, based on signals from the film growth monitor 64 indicating different growth rates at the multiple points, to move the first substrate 52 in order to change the tilt angle of the first surface 53 relative to the second surface 55 so that the gap is wedge-shaped. This helps produce a crystalline film having a more uniform thickness.

Figure 8:
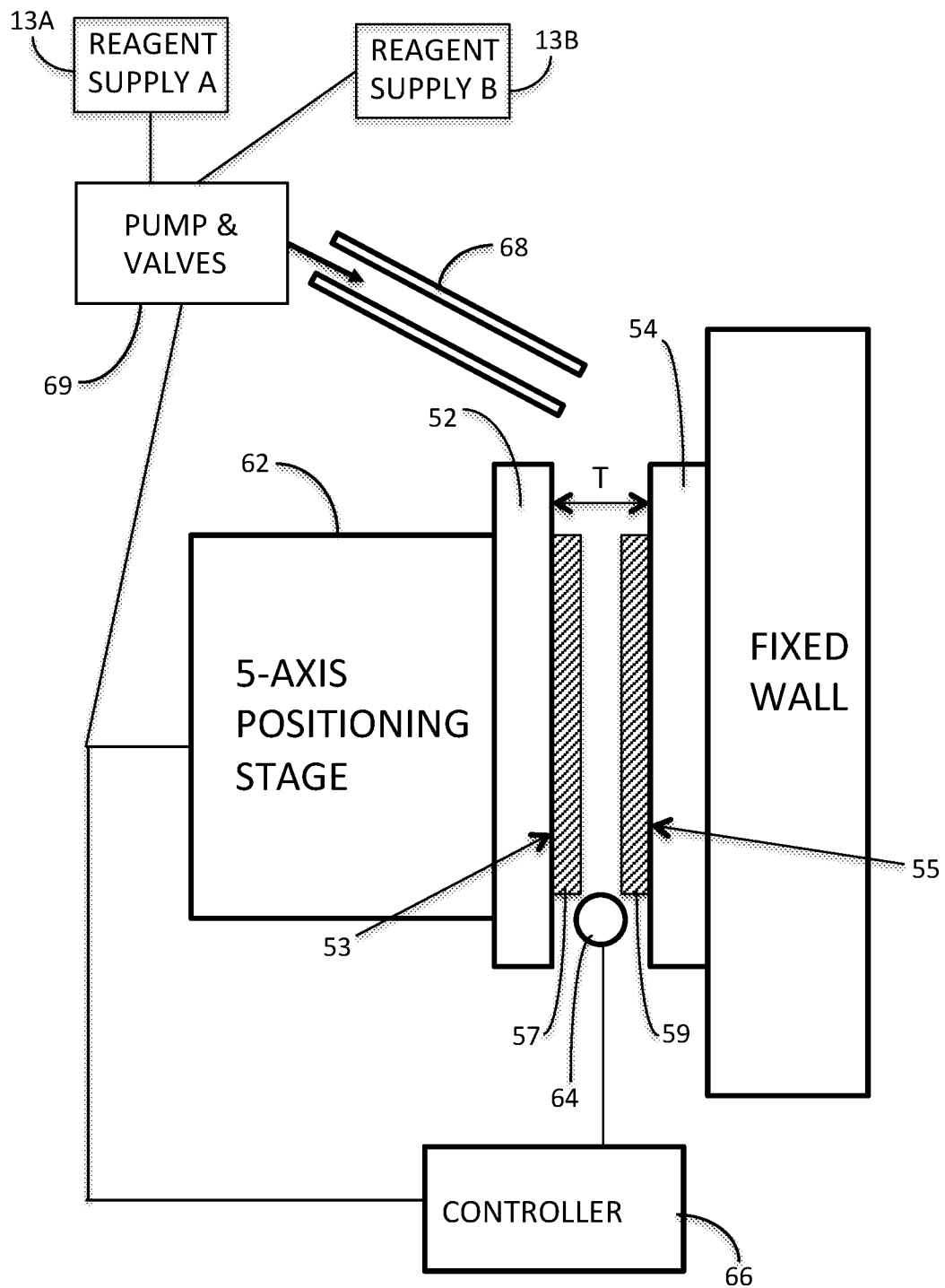
FIG. 8 is a schematic block diagram of another apparatus for producing crystalline films on substrates with feedback for reagent control, according to other embodiments.

FIG. 8 shows another embodiment of the apparatus that includes feedback from the film growth monitor 64 to control aspects of the reaction mixture (e.g., the respective concentrations of reagents, temperature and/or flow rates of the reagents in the reaction mixture). The apparatus includes at least one reagent flow channel 68 for filling the gap between the substrates 52 and 54 with at least one reaction mixture (or a series of different reaction mixtures depending upon the particular recipe for the films being used) containing the reagents sufficient to form the films 57 and 59 on the substrates. The reagents are delivered from one or more reagent supply sources 13A, 13B through at least one flow channel 68 with a pump and valve system 69. Suitable fluid delivery means for reagent solutions are known.

The controller 66 is programmed to control the pump and valve system 69 to regulate the reagent delivery from the reagent supply sources 13A, 13B through at least one flow channel 68, based on feedback from the film growth monitor 64, to adjust factors such as the temperature, the respective concentrations of the reagents, and/or the flow rates of the reagents in the reaction mixture. An example of a suitable pump is a rotary piston pump with built-in flow control (e.g., valves) for directing fluid to move in flow channels at independently controllable flow rates. In other embodiments, other types of pumps may be employed such as diaphragm, piston, plunger, and centrifugal pumps. In some embodiments, valves are separate from the at least one pump. The fact that one or more valves may be built into the pump system is just a specific embodiment and not limiting. In alternative embodiments, the reagent delivery means may comprise any source of differential pressure. For example, pressure may be supplied to the headspace of the reagent supply sources 13A, 13B to force fluid flow at desired flow rates. It will be apparent to one skilled in the art that there are many possible permutations of one or more pressure sources (e.g., pumps) and flow controllers (e.g., valves) to select which of the reagent solutions are to flow at any given time and independently control the flow rates of the solutions.

In some embodiments, the controller 66 is user-programmable. User-programmable control may be provided by LabVIEW (Laboratory Virtual Instrument Engineering Workbench) which is a system-design platform and development environment commercially available from National Instruments. In some embodiments, the controller 66 is programmed to vary the flow rates of the reagent solutions based on the feedback from the film growth monitor 64. Flow rates are preferably selected to control the respective concentrations of the reagents in the reaction mixture contacting the surfaces 53, 55 to be coated with films.

An easy way to adjust concentrations is to vary the relative flow rates of one reagent solution to another. The reaction of a reagent A with a reagent B removes reagent A and reagent B from solution at some rate as they as they react to produce the films 57, 59. So the concentration is preferably maintained in a range where enough material is reacting (reagents A and B) to form a layer of film, but not at concentrations so high that we sediment out particles, which is undesirable for the layers of films being formed. The flow rates and temperature both contribute to the process. Flow rates are typically selected to maintain the concentration of each reagent in a desired range based on the rate at which reagents are removed from solution by undergoing reaction. The ideal concentration range is sufficiently high so that the reaction occurs sufficiently quickly, but not so high as to lead to rapid particle formation and sedimentation onto the substrate from solution.

The pumps and valve system 69 may be controlled for continuous flow or for more complex flow rate profiles, such as a ramp from zero to a high flow rate F, then to a lower flow rate f, and then back to zero again. Each of the reagent solutions from reagent supply sources 13A, 13B may have the same or different flow rate profiles. In some embodiments, these flow rate profiles are coordinated with different temperatures. For example, a recipe for creating a MOF film could include: Step 1 at temperature 20° C., flow Reagent Solution A at flow rate $F_A$, and Reagent Solution B at flow rate $F_B$ for 20 minutes. Step 2 at temperature 20° C., Reagent Solutions A and B are off, wash or rinse for 5 minutes. Step 3 at temperature 200° C., flow Reagent Solution A at flow rate $F_3$ and Reagent Solution B at flow rate $F_4$ for 32 minutes. Step 4, heat at Temperature 30° C., 20 minutes, no reagents. These and many other recipes are possible where flow rate profiles are coordinated with different temperatures for different time periods.

The controller 66 may also be programmed to control the substrate positioner (e.g., a multi-axis positioning stage 62), based on the feedback from the film growth monitor 64, to adjust the average thickness T of the gap between the first and second surfaces 53 and 55, for example so that the average thickness T of the gap is less than a diffusion length of the reagents in solution. The controller 66 may also be programmed to control the multi-axis positioning stage 62, based on feedback from the film growth monitor 64, to move the first substrate 52 in order to change the tilt angle of the first surface 53 relative to the second surface 55 (e.g., so that the gap is wedge-shaped). This adjustment helps produce a crystalline film having a more uniform thickness if the film growth monitor 64 (or multiple monitors) indicates non-uniform thickness of the film being formed at different points on a substrate surface. It is to be understood that film growth monitoring, feedback control of the reagents, and substrate positioning (and thus geometry of the gap) may also be used in embodiments in which a single film is formed on a single substrate, as in the embodiments of FIG. 1 and FIG. 2.

FIGS. 9A-9D are schematic, side views of pairs of substrates having surfaces to be coated with PCP films showing various combinations of pre-cursor materials or pre-coatings on the surfaces of the substrates. The pre-cursor materials or pre-coatings interact or react with the reagents in the reaction mixture placed into the gap between the substrates to form the films. Suitable pre-cursor materials or pre-coatings on the surfaces of the substrates include: a metal oxide, a noble metal or metal source, a metal oxide coated with a functionalized self-assembled monolayer (SAM), a ligand precursor, multiple precursor layers (such as Nb and Ni), or a more complex material including at least one of these components.

Figure 9A:
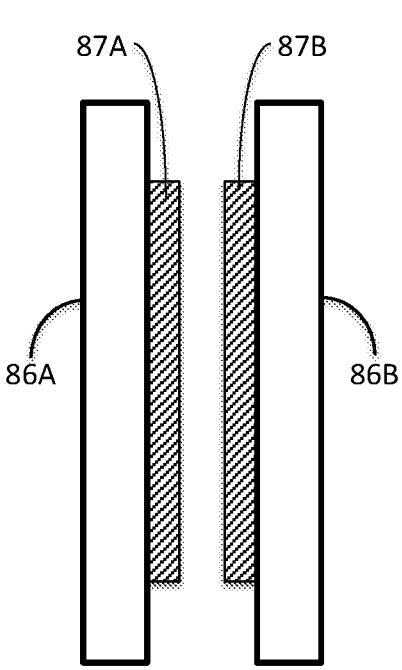
FIGS. 9A-9D are schematic, side views of pairs of substrates having surfaces to be coated with films showing various combinations of pre-cursor materials or pre-coatings on the surfaces of the substrates.
Figure 9B:
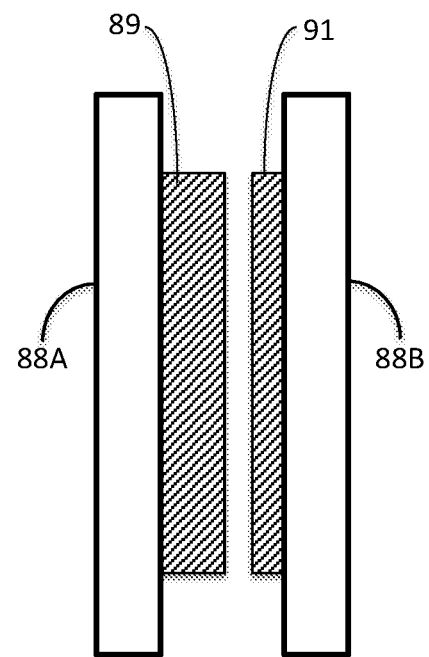
Figure 9C:
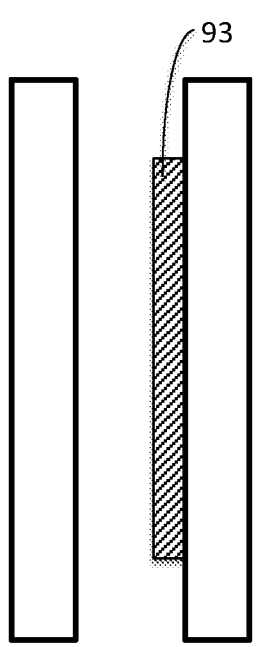
Figure 9D:
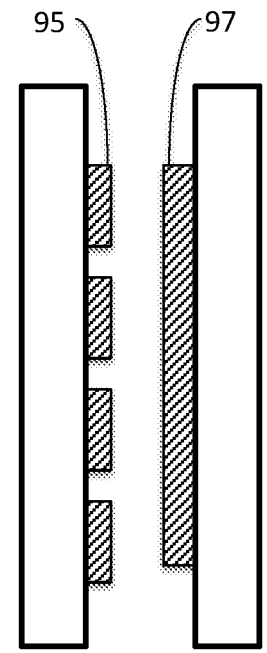

FIG. 9A shows a pair of opposing substrates 86A, 86B to be coated having identical layers 87A, 87B of pre-cursor materials or pre-coatings. In this example, the layers 87A, 87B of pre-cursor materials have identical thicknesses. FIG. 9B shows a pair of opposing substrates 88A, 88B to be coated having layers 89 and 91 of pre-cursor materials with different thicknesses. FIG. 9C shows a pair of substrates where only one of the substrates has a pre-coating 93. FIG. 9D shows a pair of substrates to be coated where the first substrate has a patterned pre-cursor material 95 to produce a patterned PCP film, and the second substrate has a continuous layer 97 of precursor material. These different combinations of pre-cursor materials and patterns permit the production of substantially identical or different crystalline films on the substrates in embodiments where pairs of substrates are coated simultaneously.

Figure 10A:
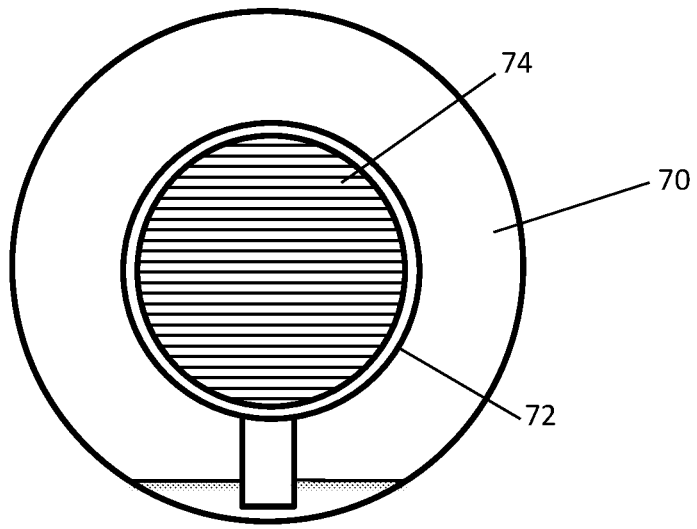
FIG. 10A is a top plan view of a quartz crystal microbalance (QCM) having a front electrode coated with an oxide film.
Figure 10B:
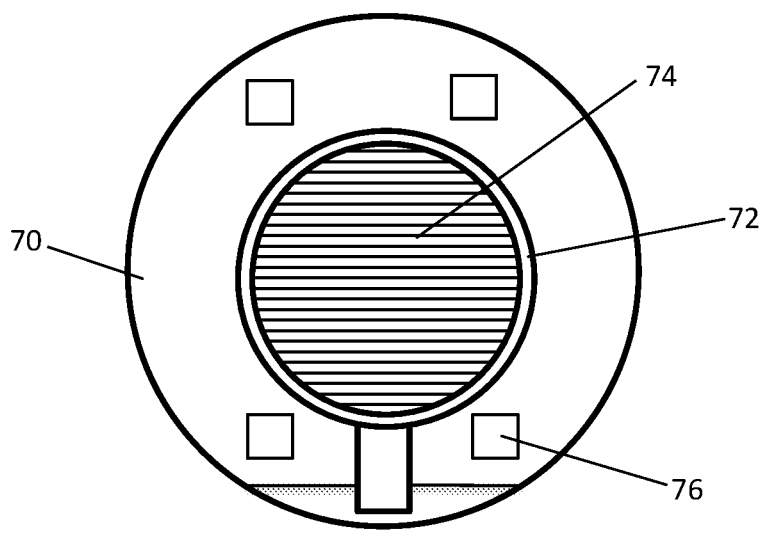
FIG. 10B is a top plan view of the QCM with shims or spacers positioned around the edges of the QCM.
Figure 10C:
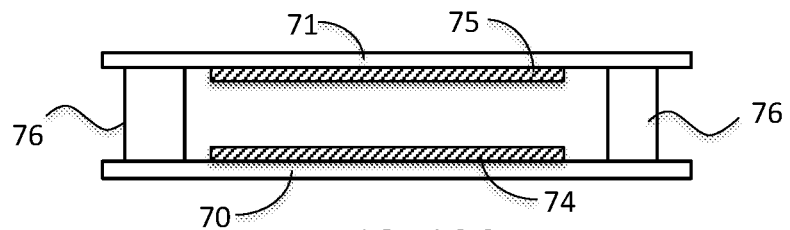
FIG. 10C is a schematic side view of the two QCMs, separated by shims or spacers.

FIGS. 10A-10C illustrate another method for producing films on substrate surfaces. In this embodiment, the substrates to be coated are quartz crystal microbalances (QCMs). FIG. 10A shows a quartz crystal microbalance (QCM) sensor 70 having a front electrode 72 (back electrode not shown). A suitable QCM is a 1" circular quartz disc with gold electrodes deposited to result in an oscillator with 5 MHz center frequency, such as product O100RX1 from Stanford Research Systems. In some embodiments, the film of porous coordination polymer is a metal-organic framework (MOF), and the surface to be coated comprises a precursor material patterned on the substrate surface. In this example, the substrate surface is prepared by depositing a layer 74 of metal oxide covering the circular gold electrode 72. A suitable metal oxide is niobium oxide ($Nb_2O_5$), and a layer of niobium oxide having a thickness of about 100 nm is deposited.

FIG. 10B shows four spacers, wedges, or shims 76 positioned around the edges of the front electrode 72 on the QCM sensor 70. In alternative embodiments, a different number of shims (e.g., 1, 2 or 3) may be used. In this example, the four shims 76 are pieces of Polytetrafluoroethylene (PTFE), and each of the shims 76 has a thickness of about 25 μm. In an optional step, approximately 0.1 mL of water is dropped onto the center of the layer 74 of metal oxide. The purpose of the water is to wet the gap to avoid bubbles or incomplete wetting due to surface tension when the sandwich assembly is inserted into a liquid reagent bath.

FIG. 10C shows a second QCM sensor 71 placed on top of the first QCM 70 to form the sandwich assembly that will be inserted into the liquid reagent bath. Each of the first and second QCMs 70 and 71 have surfaces that are pre-coated with respective layers 74, 75 of metal oxide (e.g., niobium oxide having a thickness of about 100 nm). The first and second QCMs 70 and 71 are placed into a Teflon clamp (not shown) that holds the QCMs together with a gap between their surfaces. The resulting sandwich assembly maintains the inner surfaces of the QCMs 70 and 71 (the surfaces to be coated with crystalline films) in an opposing relationship with a gap between the surfaces. The thickness of the gap between the opposing surfaces of the QCMs 70 and 71 is equal to the thickness of the shims 76. In some embodiments the shims 76 have a thickness in the range of about 25 to 75 µm to provide a corresponding gap between the surfaces of the QCMs of about 25 to 75 µm.

Figure 11:
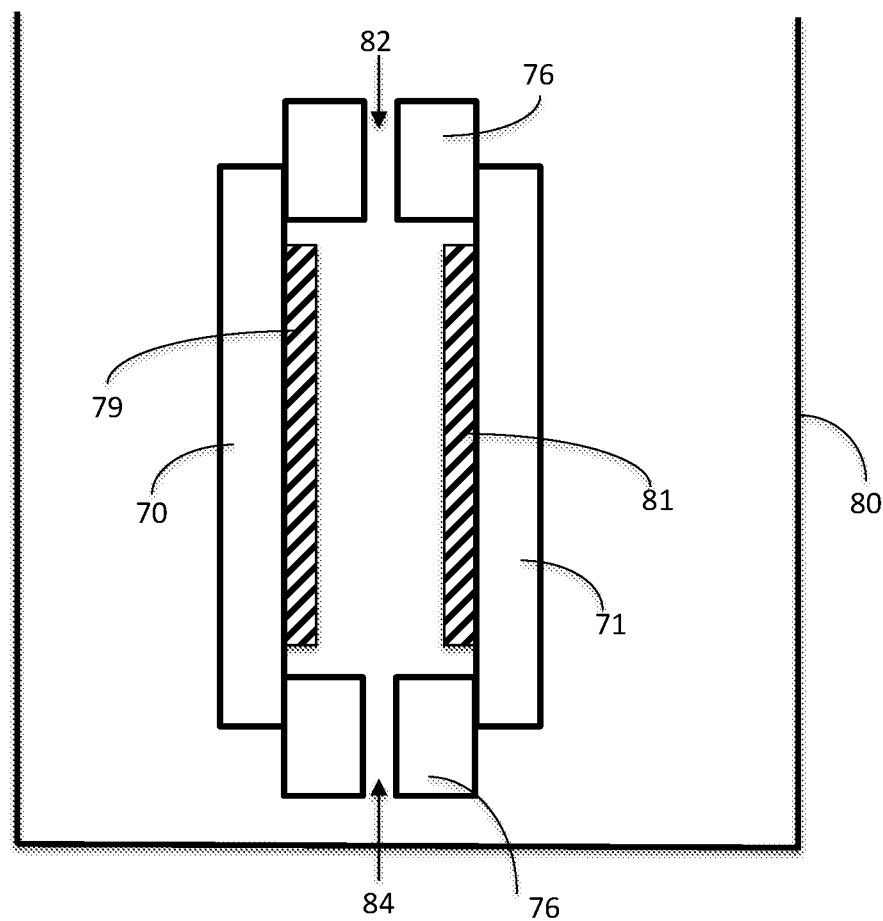
FIG. 11 is a schematic, cross-sectional view of a reaction vessel containing two substrates to be coated with films, wherein the substrates are held in an opposing relationship to each other with a gap between the substrates.

FIG. 11 shows the sandwich assembly positioned in a chamber of a reaction vessel 80 containing a reaction mixture. The spaces between the shims 76 provide an inflow port 82 and an outflow port 84 so that the reaction mixture wicks into the gap between the opposing, inner surfaces of the QCMs 70 and 71. The reaction mixture comprises reagents sufficient to form crystalline films 79 and 81 on the inner surfaces of QCMs 70 and 71, respectively. As an example, a suitable reaction mixture is a solution of 1.29 g pyrazine, 0.2 mL 50% hydrofluoric acid, 1.0 g $NiNBOF_5$, and 20 mL water. The reaction vessel 80 is sealed and heated to a temperature such as 130° C. for a time period, such as 18 hours. The sandwich assembly is then removed from the reaction vessel 80 and rinsed. In some embodiments, the film-coated QCMs 70 and 71 are separated and rinsed individually.

Many other reaction mixtures and protocols for producing the films are possible in other embodiments. The preparation of metal-organic frameworks is well known in the art (see, for example, Rowsell et al, Microporous and Mesoporous Materials 2004, 73, 3-14). Typically, the preparation of a metal-organic framework involves heating a mixture containing inorganic salts and organic compounds in a specific solvent such as DMF at a specific temperature such as in the range of 60° C. to 120° C., for a time period in the range of several hours to two days.

The description above illustrates embodiments of the invention by way of example and not necessarily by way of limitation. Many other embodiments of the apparatus and method are possible. For example, the apparatus may include multiple processing chambers, and each processing chamber may be capable of coating one or multiple substrates with a crystalline film. The substrates can be single die, multi-die, wafers, or parallel (like well plates). Further, the substrates may have dimensions that vary in size from sub-millimeter to meters.

In some embodiments, the apparatus and method may include features for controlling temperature and/or pressure. The inflow and outflow of the reaction mixture can be laminar, turbulent, stirred, or rotating. Suitable methods for stirring the reaction mixture that fills the gap between the surfaces include vibration, ultrasound, or other methods for stirring. The gap can be fixed or variable such as a ramp, dots, patterns, trenches, offset, or inter-digitated. In some embodiments, production of a crystalline film can be electrochemical with a precursor electrode.

Accordingly, the scope of the invention should be determined by the following claims and their legal equivalents.

What is claimed is:

1. A method for producing a crystalline film on at least one substrate surface, wherein the crystalline film comprises at least one porous coordination polymer, the method comprising:
   a) holding at least a first substrate having a first surface to be coated such that the first surface is positioned in a substantially opposing relationship to a second surface, wherein the second surface is provided by a wall or a second substrate, and such that a gap exists between the first and second surfaces, the gap having an average thickness less than about 2 mm;
   b) filling the gap with at least one reaction mixture comprising reagents sufficient to form the crystalline film of porous coordination polymer on at least the first surface, wherein the film thus formed has a final film thickness less than 100 µm.

2. The method of claim 1, wherein the film thickness is in the range of 1 nm to 20 µm, and the gap has an average thickness in the range of 1 µm to 1 mm.

3. The method of claim 1, further comprising the step of forming a second film on the second surface of the second substrate concurrently with the formation of the first film on the first surface of the first substrate, wherein the second film has a final film thickness less than about 100 µm.

4. The method of claim 1, wherein the porous coordination polymer is a metal-organic framework, at least the first surface to be coated comprises a precursor material patterned on a first side of the first substrate, and the precursor material reacts with the reagents in the reaction mixture to form the metal-organic framework.

5. The method of claim 1, further comprising the steps of monitoring growth of the film and changing the position of the first surface relative to the second surface to adjust the size or shape of the gap between the first and second surfaces according to signals or data indicative of film growth.

6. The method of claim 1, further comprising the steps of monitoring growth of the film, adjusting the size or shape of the gap between the first and second surfaces, and changing flow rates of the reagents to adjust the respective concentrations of the reagents in the reaction mixture.

7. The method of claim 1, further comprising the steps of monitoring growth of the film at multiple points on the first surface and adjusting the tilt angle of the first surface relative to the second surface so that the gap is wedge-shaped, if the growth monitoring indicates different growth rates at the multiple points.

8. The method of claim 1, wherein the step of holding the first substrate in the opposing relationship is preceded by the step of depositing a metal source in a pattern on at least some portions of the first surface to be coated, and the step of forming the film is followed by the step of etching portions of the film covering the patterned metal source to form a patterned film of the porous coordination polymer on at least a first side of the first substrate.

9. The method of claim 1, wherein at least the first surface to be coated is formed by at least one layer of a nucleation material disposed on a first side of the first substrate, and the step of holding the first substrate in the opposing relationship is preceded by the step of patterning a nucleation resist material on some portions of the layer of nucleation material so that the film grows only on other portions of the nucleation material that are not covered by the nucleation resist material.

10. The method of claim 1, wherein the first surface to be coated is formed by a nucleation material patterned on a layer of a nucleation resist material disposed on at least the first side of the first substrate, so that the nucleation material covers some portions of the nucleation resist material.

11. The method of claim 1, wherein the substrate comprises a quartz crystal, the first surface to be coated comprises a metal oxide covering an electrode on a first side of the substrate, and the metal-oxide reacts with the reagents in the reaction mixture to form the film of porous coordination polymer.

* * * * *